US012740423B2

(12) United States Patent
Otsubo et al.

(10) Patent No.: US 12,740,423 B2
(45) Date of Patent: Sep. 15, 2026

(54) MODULE

(71) Applicant: Murata Manufacturing Co., Ltd., Kyoto-fu (JP)

(72) Inventors: Yoshihito Otsubo, Nagaokakyo (JP); Tsuyoshi Takakura, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 355 days.

(21) Appl. No.: 18/588,564

(22) Filed: Feb. 27, 2024

(65) Prior Publication Data

US 2024/0203902 A1 Jun. 20, 2024

Related U.S. Application Data

(63) Continuation of application No. PCT/JP2022/031201, filed on Aug. 18, 2022.

(30) Foreign Application Priority Data

Sep. 30, 2021 (JP) ................................ 2021-161900

(51) Int. Cl.
*H01L 23/552* (2006.01)
*H01L 23/00* (2006.01)
(Continued)

(52) U.S. Cl.
CPC .......... *H10W 42/20* (2026.01); *H10W 74/114* (2026.01); *H10W 90/754* (2026.01)

(58) Field of Classification Search
CPC . H10W 42/20; H10W 74/114; H10W 90/754; H10W 90/00; H10W 72/50; H10W 99/00
See application file for complete search history.

(56) References Cited

U.S. PATENT DOCUMENTS 12,125,806 B2 * 10/2024 Pun ..................... H10W 40/778
2006/0148317 A1 * 7/2006 Akaike ............. H01R 12/7076
439/607.01

(Continued)

FOREIGN PATENT DOCUMENTS

JP 2016-115722 A 6/2016
WO 2020/0158500 A1 8/2020

OTHER PUBLICATIONS

International Search Report for PCT/JP2022/031201 dated Nov. 1, 2022.

*Primary Examiner* — Leonardo Andujar
(74) *Attorney, Agent, or Firm* — McDonald Hopkins LLC

(57) ABSTRACT

A module includes: one or more electronic components and one or more pad electrodes disposed and aligned such that lower ends thereof are positioned on a reference surface; and a sealing resin disposed to seal the one or more pad electrodes and the one or more electronic components. A first surface serving as an upper surface and a second surface serving as a side surface of the sealing resin are covered with a shield film. A first wire and a second wire are disposed in the sealing resin to electrically connect the one or more pad electrodes and the shield film at a first point and a second point, respectively, that are selected from the first surface and the second surface. The first point and the second point are different in height when viewed from the reference surface.

12 Claims, 22 Drawing Sheets

(51) Int. Cl.

*H01L 23/31* (2006.01)
*H10W 42/20* (2026.01)
*H10W 74/10* (2026.01)
*H10W 90/00* (2026.01)

(56) References Cited

U.S. PATENT DOCUMENTS

2008/0272469 A1 11/2008 Kwak et al.
2015/0171021 A1 * 6/2015 Takano ................. H10W 42/20
257/659
2019/0067208 A1 2/2019 Lin
2021/0350196 A1 11/2021 Yoshimori

* cited by examiner 101
1
34
33
8
32
1a
1b
4
5
31
6
6a
42
7
82
6b
81
41

MODULE

CROSS REFERENCE TO RELATED APPLICATION

This is a continuation of International Application No. PCT/JP2022/031201 filed on Aug. 18, 2022 which claims priority from Japanese Patent Application No. 2021-161900 filed on Sep. 30, 2021. The contents of these applications are incorporated herein by reference in their entireties.

BACKGROUND OF THE DISCLOSURE

Field of the Disclosure

The present disclosure relates to a module.

Description of the Related Art

Japanese Patent Laid-Open No. 2016-115722 (PTL 1) discloses a device including a configuration in which a semiconductor chip is mounted on a substrate and the semiconductor chip is covered with a resin. In this device, a linear electric conductor such as a loop wire is disposed in the resin, and the electric conductor is exposed to an upper surface of the resin and an exposed portion of the electric conductor is electrically connected to a shield layer. In this way, the shield layer is electrically connected to a GND terminal.

PTL 1 also discloses a configuration in which an electric conductor is exposed to a side surface of a resin, not to an upper surface of the resin, and the electric conductor is electrically connected to a shield layer.

PTL 1: Japanese Patent Laid-Open No. 2016-115722

BRIEF SUMMARY OF THE DISCLOSURE

In PTL 1, a position at which the wire serving as the electric conductor is exposed from the sealing resin is the side surface or the upper surface of the sealing resin and is uniform in height. Actually, however, in the module, there are variations in strength of an electromagnetic wave, depending on electromagnetic interference between components in the module, and a placement location of the target module in a housing. In order to enhance the shielding performance of a portion in which shielding should be reinforced, it is required to reinforce grounding of shielding. Sufficient grounding of shielding is not achieved only by the configuration described in PTL 1.

Accordingly, a possible benefit of the present disclosure is to provide a module that allows flexible enhancement of the shielding performance of a portion in which shielding should be reinforced.

In order to achieve the above-described possible benefit, a module based on the present disclosure includes: one or more electronic components disposed and aligned such that lower ends thereof are positioned on a reference surface; one or more pad electrodes disposed such that lower ends thereof are positioned on the reference surface; and a sealing resin disposed to seal the one or more pad electrodes and the one or more electronic components from above, wherein the sealing resin has a first surface serving as an upper surface and a second surface serving as a side surface, the first surface and the second surface are covered with a shield film, a first wire is disposed in the sealing resin to electrically connect the one or more pad electrodes and the shield film at a first point selected from the first surface and the second surface, a second wire is disposed in the sealing resin to electrically connect the one or more pad electrodes and the shield film at a second point selected from the first surface and the second surface, and the first point and the second point are different in height when viewed from the reference surface.

According to the present disclosure, connections to the first point and the second point that are different in height are made by the first wire and the second wire, respectively, which allows flexible enhancement of the shielding performance of a portion in which shielding should be reinforced.

BRIEF DESCRIPTION OF THE SEVERAL VIEWS OF THE DRAWINGS

FIG. 5 is a cross-sectional view of a module according to a third embodiment based on the present disclosure.

FIG. 7 is a cross-sectional view of a module according to a fourth embodiment based on the present disclosure.

FIG. 9 is a cross-sectional view of a module according to a fifth embodiment based on the present disclosure.

FIG. 13 is a cross-sectional view of a module according to a seventh embodiment based on the present disclosure.

FIG. 17 is a cross-sectional view of a module according to an eighth embodiment based on the present disclosure.

FIG. 19 is a cross-sectional view of a module according to a ninth embodiment based on the present disclosure.

FIG. 21 is a cross-sectional view of a module according to a tenth embodiment based on the present disclosure.

DETAILED DESCRIPTION OF THE DISCLOSURE

Figure 1:
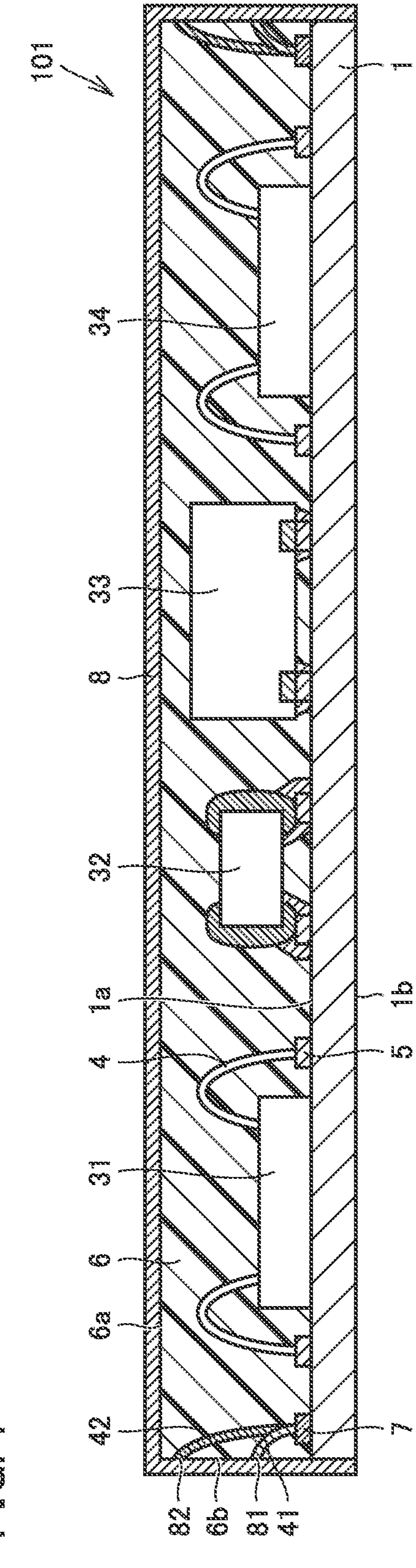
FIG. 1 is a cross-sectional view of a module according to a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

The shape, the type, the number, the position, and the mounting method of each electronic component described in the embodiments below are merely by way of example and are not limited thereto.

First Embodiment

Figure 2:
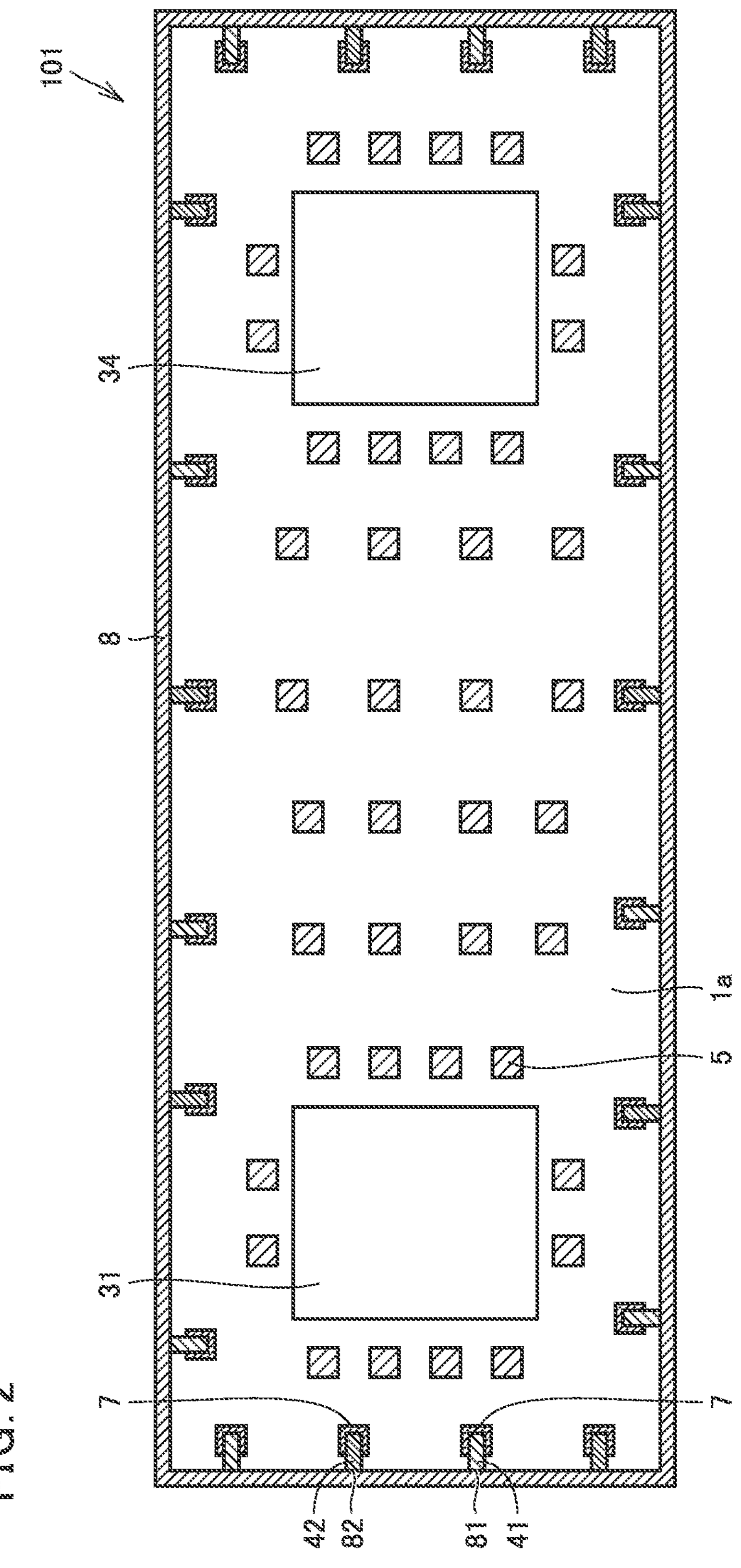
FIG. 2 is a schematic plan view of the module according to the first embodiment based on the present disclosure.

A module according to a first embodiment based on the present disclosure will be described with reference to FIGS. 1 to 2. FIG. 1 shows a cross-sectional view of a module 101 according to the present embodiment. Module 101 includes a substrate 1. Substrate 1 has a substrate first surface 1*a* and a substrate second surface 1*b*. Electronic components 31, 32, 33, and 34 are mounted on substrate first surface 1*a*. Pad electrodes 5 and 7 are provided on substrate first surface 1*a*. Each of electronic components 31 and 34 includes an electrode (not shown) on an upper surface thereof. The electrode on the upper surface of each of electronic components 31 and 34 and pad electrode 5 are electrically connected by using a wire 4. That is, each of electronic components 31 and 34 is wire-bonded to substrate 1. Pad electrode 5 is for signal connection with each electronic component or for grounding. Pad electrode 7 is for grounding. Each electronic component mounted on substrate first surface 1*a* is sealed by a sealing resin 6. An upper surface and a side surface of sealing resin 6 are covered with a shield film 8. Shield film 8 also covers a side surface of substrate 1. In module 101, substrate first surface 1*a* corresponds to "reference surface". FIG. 2 shows a plan view of module 101 from which a portion of shield film 8 that covers an upper surface of module 101, sealing resin 6, electronic components 32 and 33, and wire 4 are removed.

Module 101 according to the present embodiment includes: one or more electronic components 31, 32, 33, and 34 disposed and aligned such that lower ends thereof are positioned on the reference surface; one or more pad electrodes 7 disposed such that lower ends thereof are positioned on the reference surface; and sealing resin 6 disposed to seal one or more pad electrodes 7 and one or more electronic components 31, 32, 33, and 34 from above. Sealing resin 6 has a first surface 6*a* serving as an upper surface and a second surface 6*b* serving as a side surface. First surface 6*a* and second surface 6*b* are covered with shield film 8. A first wire 41 is disposed in sealing resin 6 to electrically connect one or more pad electrodes 7 and shield film 8 at a first point 81 selected from first surface 6*a* and second surface 6*b*. A second wire 42 is disposed in sealing resin 6 to electrically connect one or more pad electrodes 7 and shield film 8 at a second point 82 selected from first surface 6*a* and second surface 6*b*. First point 81 and second point 82 are different in height when viewed from the reference surface. In the example described in the present embodiment, both of first point 81 and second point 82 are selected from second surface 6*b*. Although first wire 41 and second wire 42 may be wires made of the same material and having the same thickness, a group of a plurality of wires connected to first point 81 or points having the same height as that of first point 81 (hereinafter, this group will be referred to as "first group" and first wire 41 is also included in the first group), and a group of a plurality of wires connected to second point 82 or points having the same height as that of second point 82 (hereinafter, this group will be referred to as "second group" and second wire 42 is also included in the second group) are shown by different types of hatching in FIGS. 1 and 2 for the sake of convenience of description. As shown in FIG. 2, in the vicinity of an outer perimeter of substrate first surface 1*a*, pad electrode 7 to which the wires belonging to the first group are connected and pad electrode 7 to which the wires belonging to the second group are connected are arranged substantially alternately.

In the present embodiment, since first wire 41 and second wire 42 connect one or more pad electrodes 7 and shield film 8, the shielding performance of shield film 8 can be enhanced. Particularly, since connections to first point 81 and second point 82 that are different in height are made by first wire 41 and second wire 42, respectively, shielding can be appropriately reinforced in consideration of the strength of an electromagnetic wave around module 101 or interference between the components. Even when a direction in which an electromagnetic wave reaches module 101 or a direction in which an electromagnetic wave is emitted from module 101 is an upward direction or a diagonally upward high direction of module 101, shielding can be reinforced at an appropriate location in accordance with the actual needs, because first wire 41 or second wire 42 can also be connected to a high position of shield film 8 in the present embodiment. In other words, the module according to the present embodiment allows flexible enhancement of the shielding performance of a portion in which shielding should be reinforced.

(Manufacturing Method)

Module 101 described in the present embodiment can, for example, be produced as follows. An aggregate substrate is prepared. The aggregate substrate is a large-sized substrate corresponding to a state in which substrates 1 included in a plurality of modules 101 are arranged in a matrix. One surface of the aggregate substrate corresponds to subsequent substrate first surface 1*a*. Pad electrodes 5 and 7 are formed in advance on this surface of the aggregate substrate. Electronic components 31, 32, 33, and 34 are mounted on this surface of the aggregate substrate as needed.

Each of first wire 41 and second wire 42 is bonded in an arch shape to extend over a region of this surface of the aggregate substrate corresponding to two modules adjacent to each other. Both ends of each of first wire 41 and second wire 42 are bonded to pad electrode 7 disposed on the surface of the aggregate substrate. Furthermore, wire 4 is bonded as needed. Wire 4 electrically connects pad electrode 5 and electronic component 31. Sealing resin 6 is disposed to seal electronic components 31, 32, 33, and 34, wire 4, first wire 41, and second wire 42.

Next, sealing resin 6 and substrate 1 are cut into pieces each equivalent in size to individual module 101. By doing so, first wire 41 and second wire 42 bonded in an arch shape to substrate first surface 1*a* are divided into two pieces.

Thereafter, sputtering is performed and shield film 8 is thus formed to cover the upper surface and the side surface of sealing resin 6 and the side surface of substrate 1. As a result, first wire 41 is electrically connected to shield film 8 at first point 81, and second wire 42 is electrically connected to shield film 8 at second point 82.

When first point 81 and second point 82 are points selected from second surface 6*b* serving as the side surface, module 101 can be produced by such a method. That is, the wires bonded in an arch shape to extend over a region corresponding to two modules adjacent to each other are divided into two pieces together with sealing resin 6, and the wires disposed in a semi-arch shape can thus be obtained.

Second Embodiment

Figure 3:
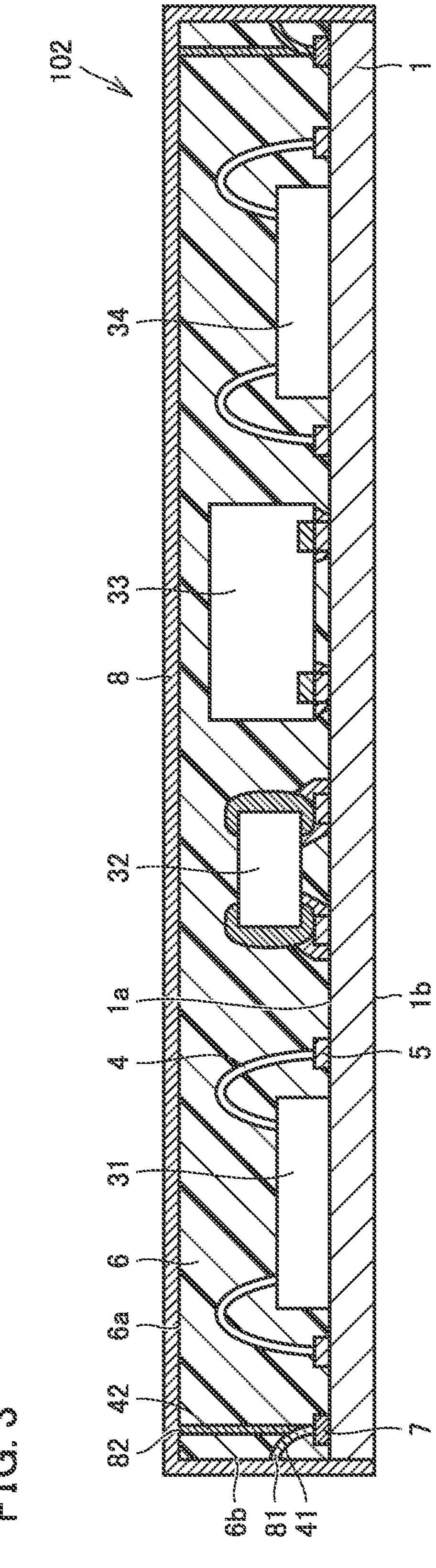
FIG. 3 is a cross-sectional view of a module according to a second embodiment based on the present disclosure.

A module according to a second embodiment based on the present disclosure will be described with reference to FIGS. 3 to 4. FIG. 3 shows a cross-sectional view of a module 102 according to the present embodiment. Module 102 and module 101 described in the first embodiment are common in terms of a basic configuration. In module 102, second point 82 is selected from first surface 6*a* of sealing resin 6. First point 81 is selected from second surface 6*b* of sealing resin 6. That is, first wire 41 is connected to shield film 8 on a side surface of module 102, and second wire 42 is connected to shield film 8 on an upper surface of module 102.

Figure 4:
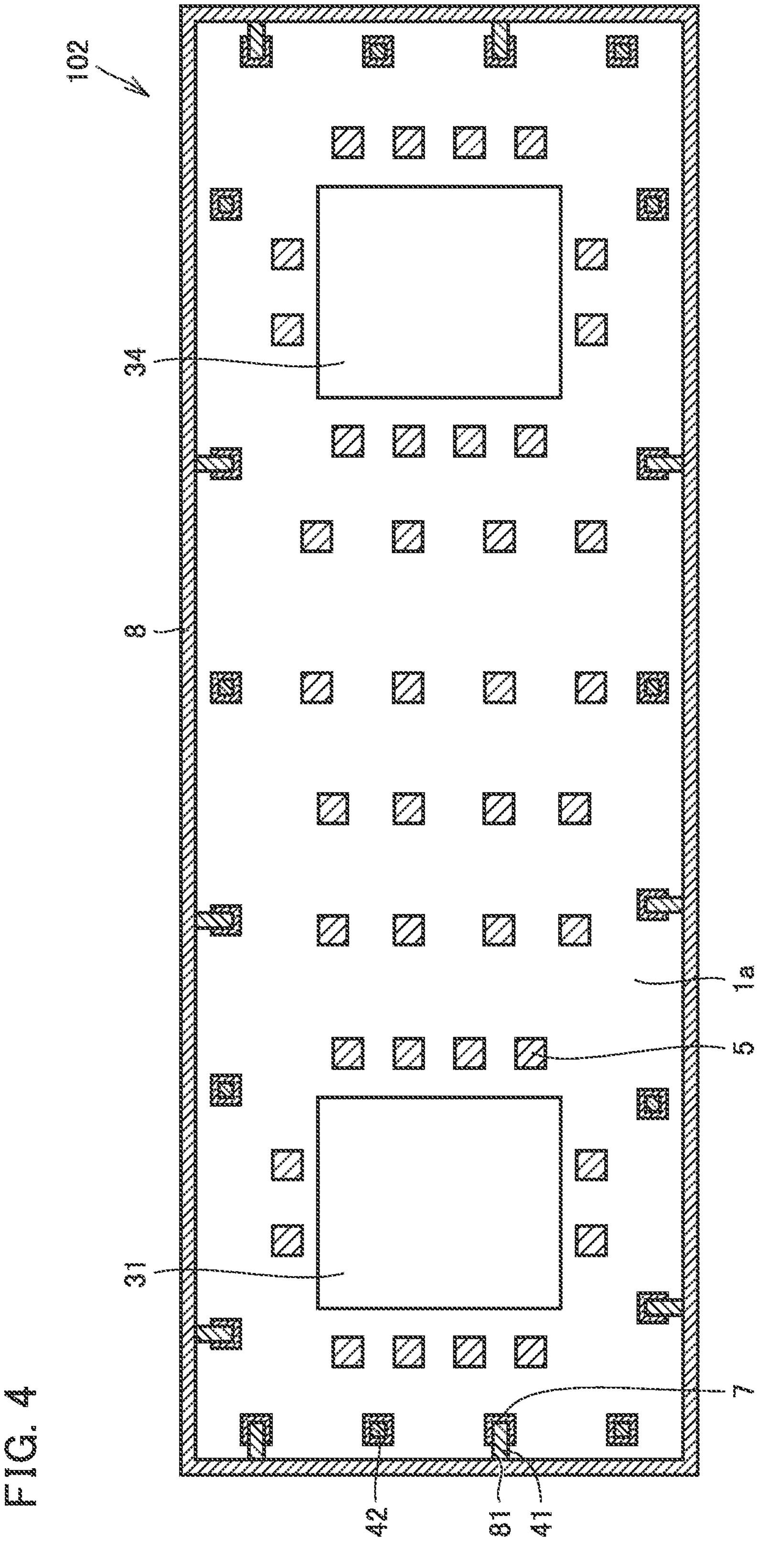
FIG. 4 is a schematic plan view of the module according to the second embodiment based on the present disclosure.

FIG. 4 shows a plan view of module 102 from which a portion of shield film 8 that covers the upper surface of module 102, sealing resin 6, electronic components 32 and 33, and wire 4 are removed.

In the present embodiment, since first wire 41 is connected to shield film 8 on the side surface and second wire 42 is connected to shield film 8 on the upper surface, shielding of shield film 8 can be reinforced on both the upper surface and the side surface. Therefore, sufficiently strong shielding against an electromagnetic wave coming from above or an electromagnetic wave emitted upward can also be achieved.

In the present embodiment, second wire 42 is shown to extend linearly and vertically toward second point 82. Actually, however, second wire 42 is not limited to being linear. A part or all of second wire 42 may be curved.

(Manufacturing Method)

Module 102 described in the present embodiment can, for example, be produced as follows. A manufacturing method of module 102 is similar to the manufacturing method of module 101 according to the first embodiment, in that module 102 is produced by using an aggregate substrate and division is performed after sealing resin 6 is formed. Second wire 42 of module 102 is connected to shield film 8 on the upper surface. In order to obtain such a wire structure, it is possible to adopt a method for bonding one end of a wire that will form second wire 42 to pad electrode 7, and drawing out the wire upward and then tearing off the wire at a desired height. By doing so, a structure in which second wire 42 stands on substrate first surface 1*a* is obtained.

Sealing resin 6 is disposed to seal electronic components 31, 33 and 34, wire 4, first wire 41, and second wire 42. When sealing resin 6 is disposed, the height of sealing resin 6 is such a height that an upper end of second wire 42 is exposed. As needed, the upper surface of sealing resin 6 may be subjected to grinding such that the upper surface of sealing resin 6 and an upper end of second wire 42 are located on the same plane.

Thereafter, sputtering is performed and shield film 8 is thus formed to cover the upper surface and the side surface of sealing resin 6 and the side surface of substrate 1. As a result, first wire 41 is electrically connected to shield film 8 at first point 81 on the side surface, and second wire 42 is electrically connected to shield film 8 at second point 82 on the upper surface.

A wire disposed to connect a point set on a side surface and pad electrode 7, and a wire disposed to connect a point set on an upper surface and pad electrode 7 appear in the below-described embodiments as well. A desired wire structure can be obtained by applying the idea of the manufacturing methods described in the first and second embodiments.

Third Embodiment

Figure 5:
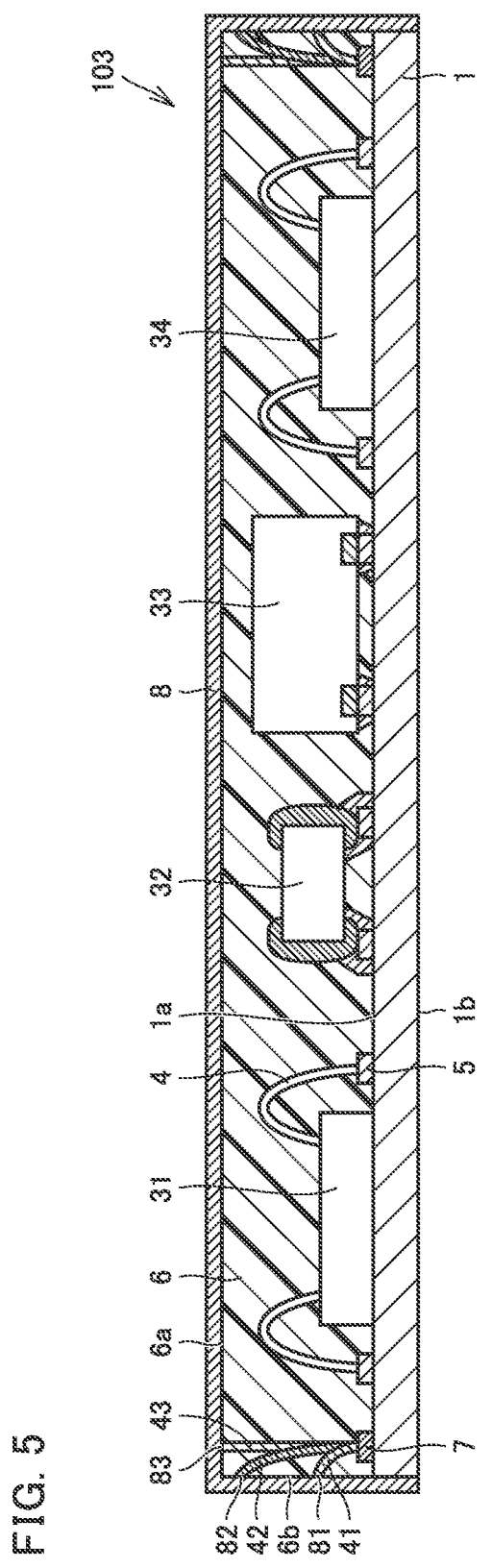

A module according to a third embodiment based on the present disclosure will be described with reference to FIGS. 5 to 6. FIG. 5 shows a cross-sectional view of a module 103 according to the present embodiment. Module 103 and module 102 described in the second embodiment are common in terms of a basic configuration. In module 103, both of first point 81 and second point 82 are selected from second surface 6*b* of sealing resin 6. First point 81 and second point 82 are located at different heights. First wire 41 and second wire 42 are connected to shield film 8 at first point 81 and second point 82 selected from second surface 6*b* of sealing resin 6, respectively. Furthermore, in module 103, a third point 83 is selected from first surface 6*a* of sealing resin 6. Pad electrode 7 and shield film 8 at third point 83 are connected by a third wire 43.

Figure 6:
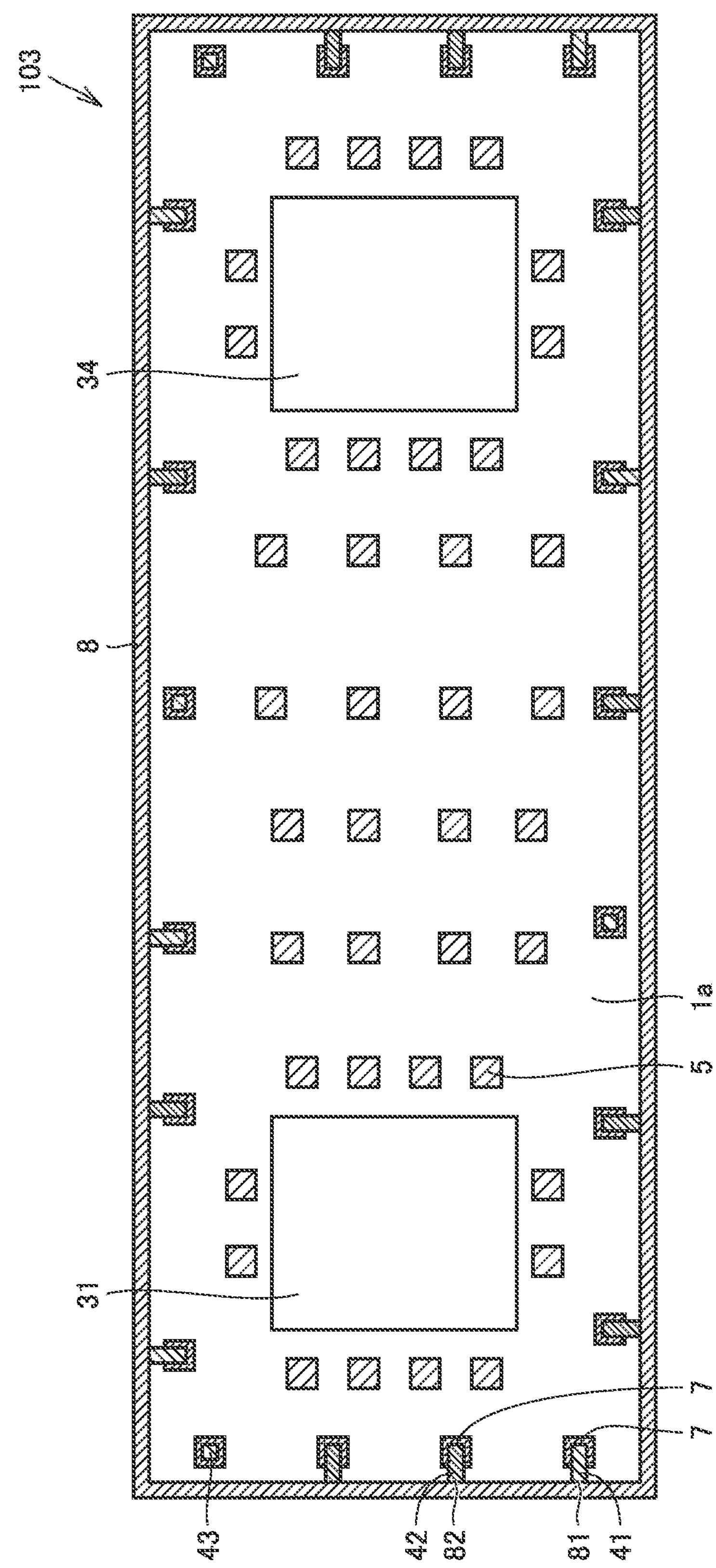
FIG. 6 is a schematic plan view of the module according to the third embodiment based on the present disclosure.

FIG. 6 shows a plan view of module 103 from which a portion of shield film 8 that covers an upper surface of module 103, sealing resin 6, electronic components 32 and 33, and wire 4 are removed.

In the present embodiment, connection to shield film 8 is also made by the wire at third point 83 selected from first surface 6*a* of sealing resin 6, in addition to first point 81 and second point 82 located at the two positions of different heights selected from second surface 6*b* of sealing resin 6. Therefore, in addition to the effects described in the first and second embodiments, the shielding performance of shield film 8 can be further enhanced.

Fourth Embodiment

Figure 7:
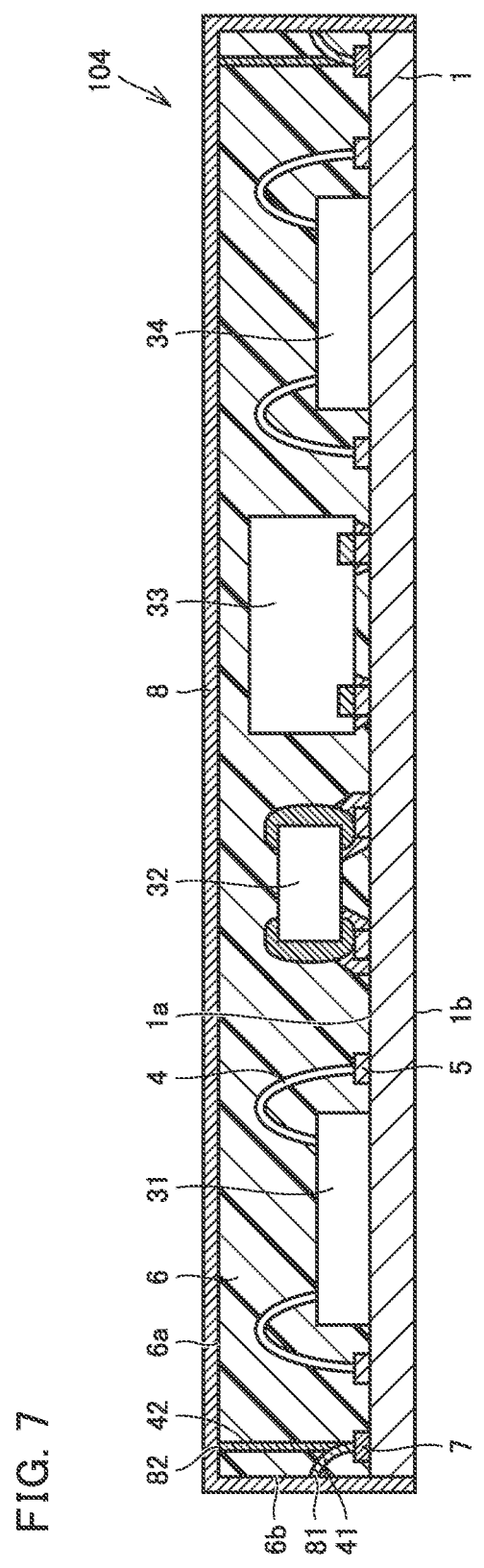
Figure 8:
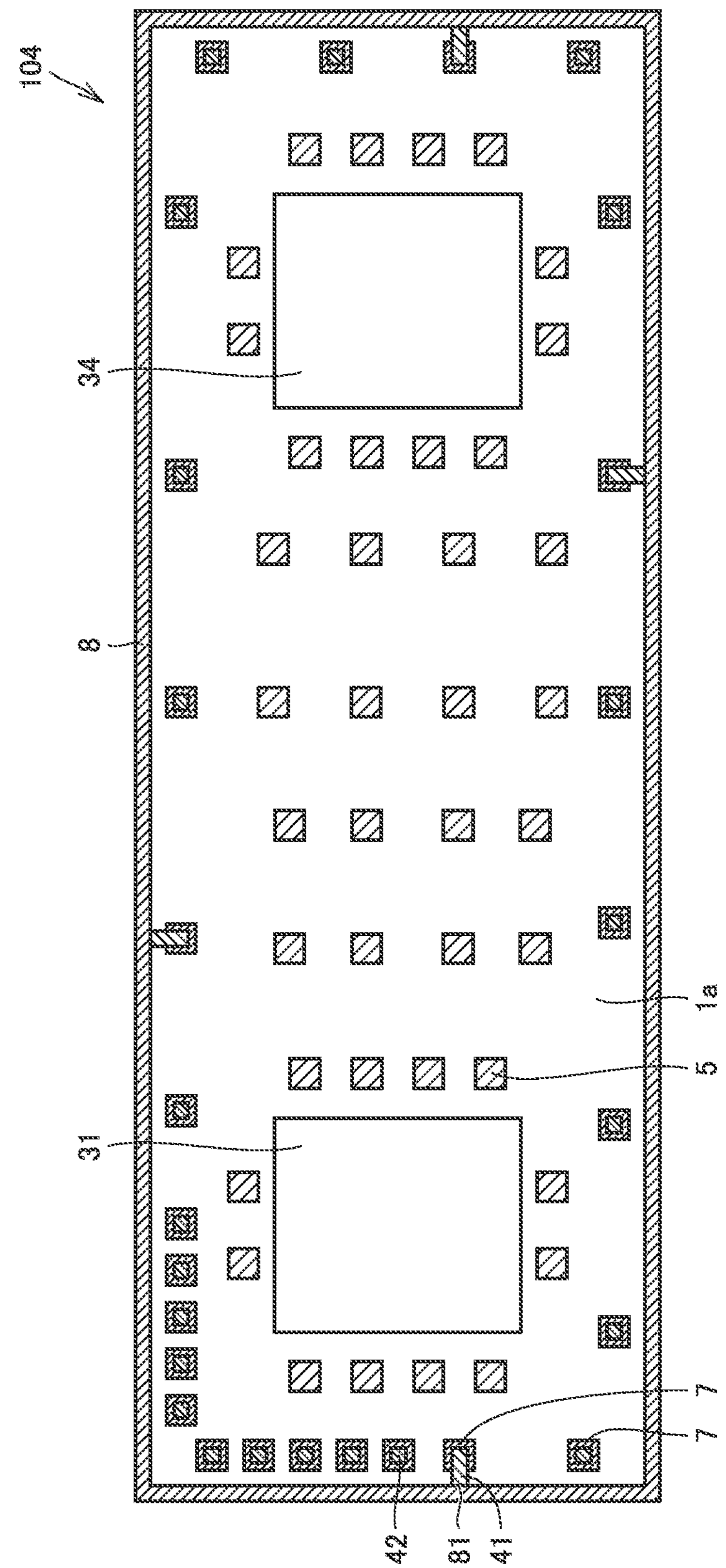
FIG. 8 is a schematic plan view of the module according to the fourth embodiment based on the present disclosure.

A module according to a fourth embodiment based on the present disclosure will be described with reference to FIGS. 7 to 8. FIG. 7 shows a cross-sectional view of a module 104 according to the present embodiment. FIG. 8 shows a plan view of module 104 from which a portion of shield film 8 that covers an upper surface of module 104, sealing resin 6, electronic components 32 and 33, and wire 4 are removed.

Module 104 and module 102 described in the second embodiment are common in terms of a basic configuration. In module 104, many second wires 42 are disposed in a portion in which shielding should be particularly reinforced. That is, many pad electrodes 7 are densely disposed in the proximity of an upper left corner in FIG. 8, and many second wires 42 connected to these pad electrodes 7 are densely disposed.

According to the present embodiment, when shielding should be particularly reinforced in a specific location of the module, shielding of the desired location can be reinforced in accordance with the request.

Fifth Embodiment

Figure 9:
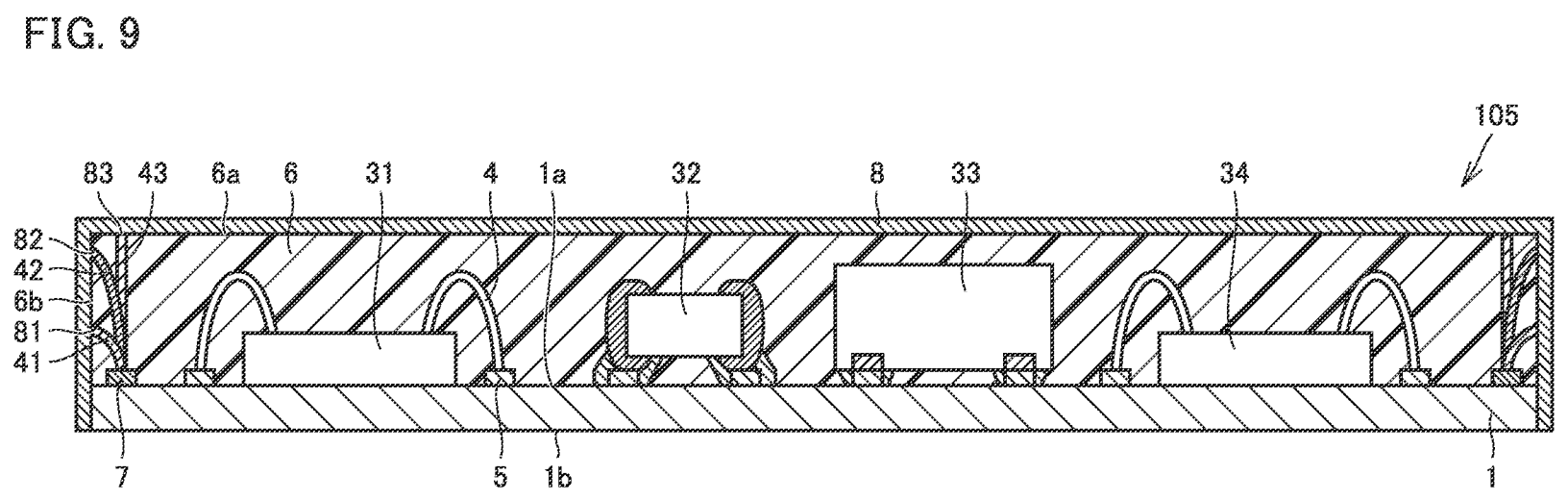
Figure 10:
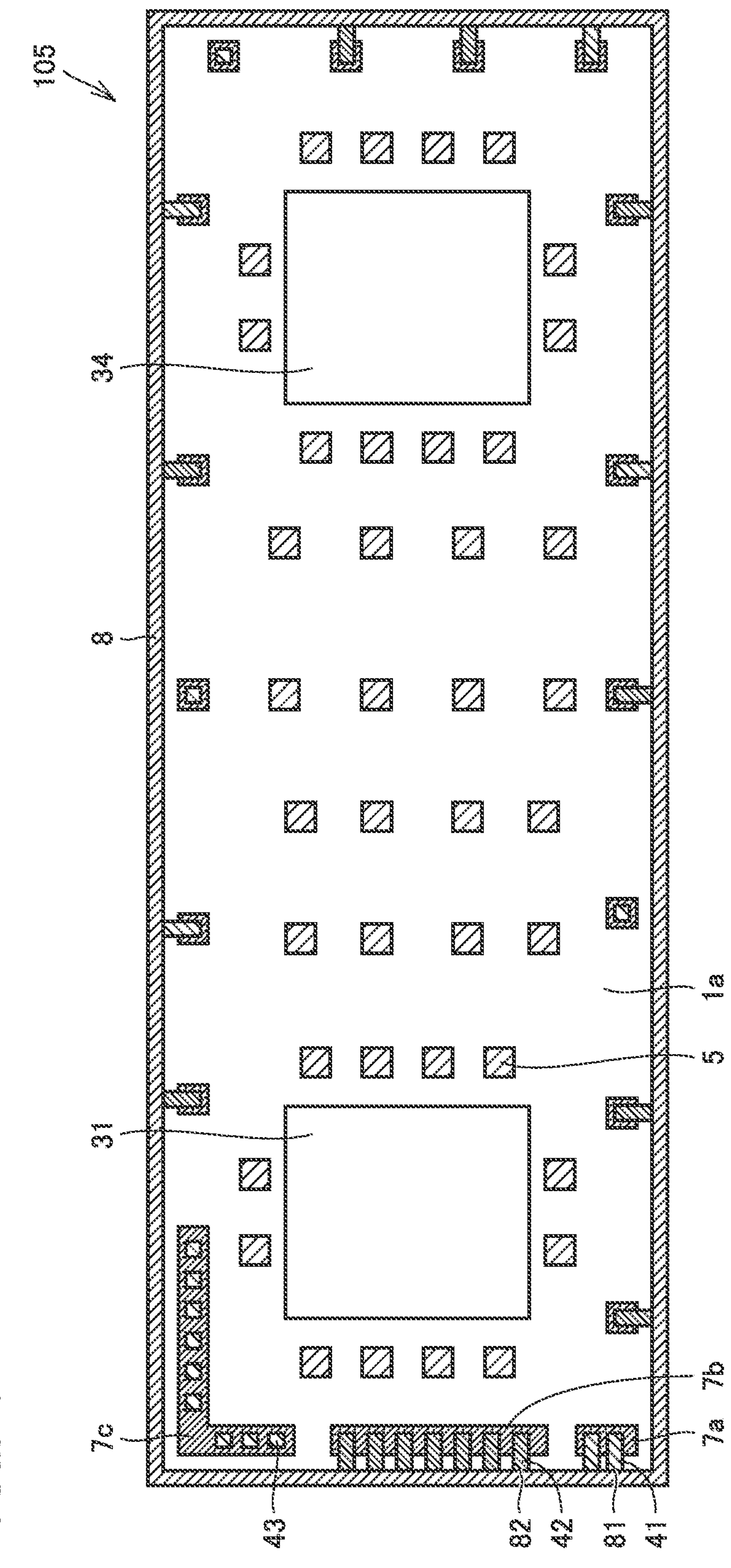
FIG. 10 is a schematic plan view of the module according to the fifth embodiment based on the present disclosure.

A module according to a fifth embodiment based on the present disclosure will be described with reference to FIGS. 9 to 10. FIG. 9 shows a cross-sectional view of a module 105 according to the present embodiment. FIG. 10 shows a plan view of module 105 from which a portion of shield film 8 that covers an upper surface of module 105, sealing resin 6, electronic components 32 and 33, and wire 4 are removed. Module 105 includes pad electrodes 7*a*, 7*b* and 7*c*. Pad electrodes 7*a*, 7*b* and 7*c* are disposed on substrate first surface 1*a*. A plurality of wires (including first wire 41) connected to shield film 8 at first point 81 on second surface 6*b* of sealing resin 6 and points having the same height as that of first point 81 are collectively connected to pad electrode 7*a*. A plurality of wires (including second wire 42) connected to shield film 8 at second point 82 on second surface 6*b* of sealing resin 6 and points having the same height as that of second point 82 are collectively connected to pad electrode 7*b*. A plurality of wires (including third wire 43) connected to shield film 8 at third point 83 on first surface 6*a* of sealing resin 6 and points having the same height as that of third point 83 are collectively connected to pad electrode 7*c*. In FIG. 9, pad electrodes 7*a*, 7*b* and 7*c* are collectively shown as pad electrode 7 in a schematic manner.

Unlike a configuration in which a pad electrode is individually provided for each one of wires connected to shield film 8, an integrated pad electrode is provided for a plurality of wires connected to shield film 8 in the present embodiment, which allows collective electrical connection to this pad electrode. For example, since one pad electrode is connected to a plurality of wires and grounding of this pad electrode can be performed by one conductor via, the structure can be simplified. A conductor via having a large cross-sectional area can be used, and thus, lower resistance can be achieved.

Sixth Embodiment

Figure 11:
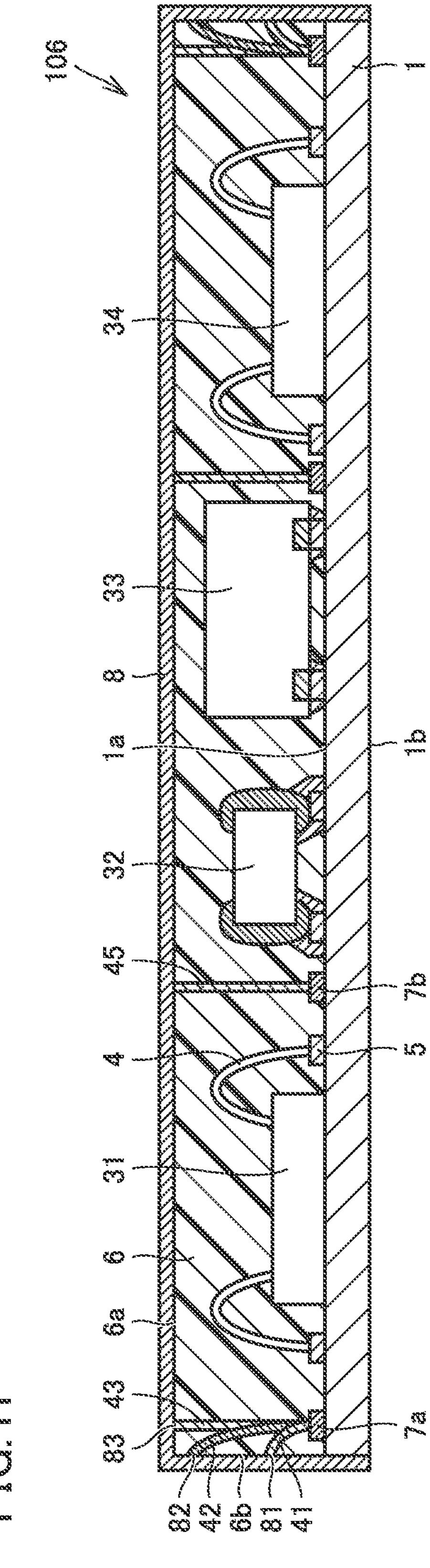
FIG. 11 is a cross-sectional view of a module according to a sixth embodiment based on the present disclosure.
Figure 12:
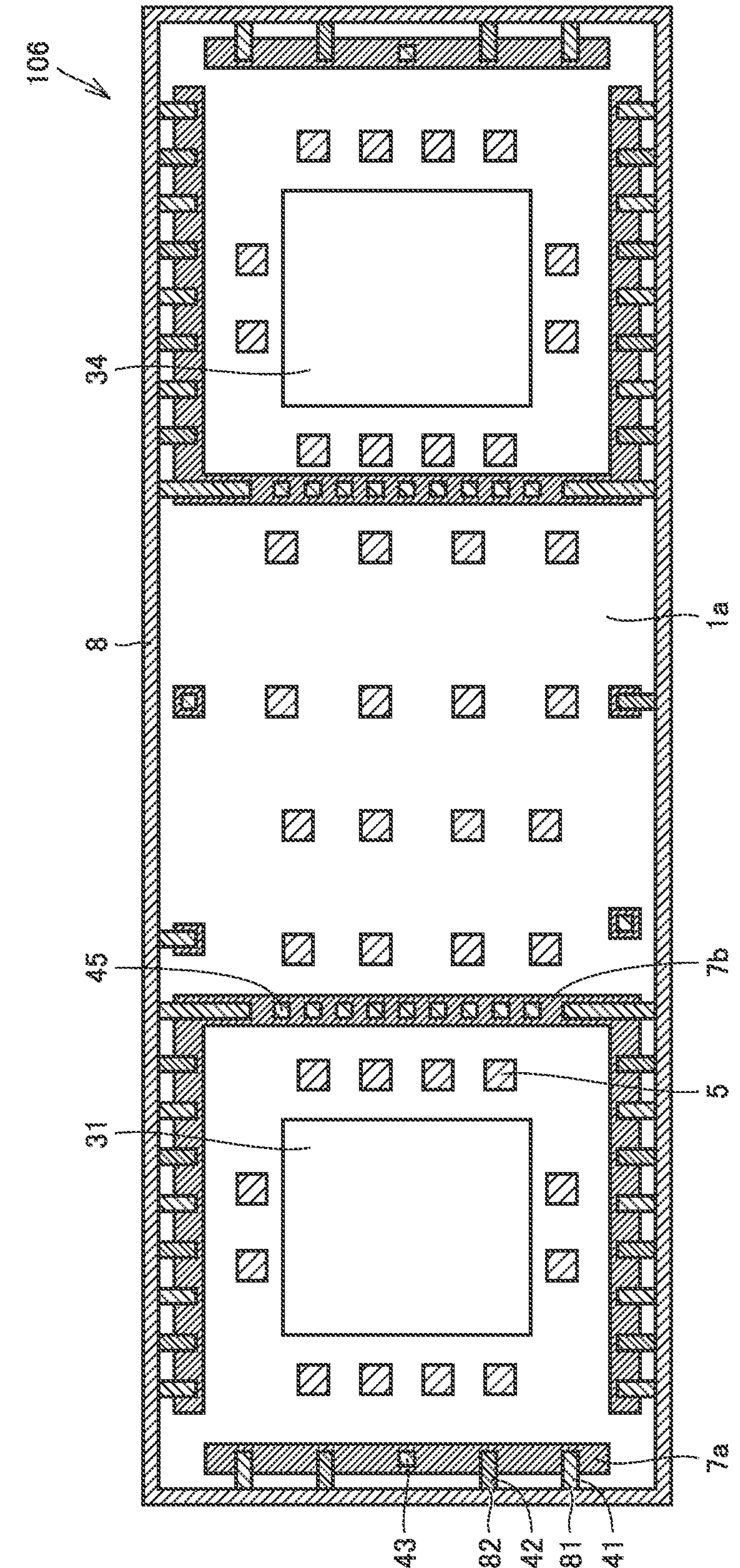
FIG. 12 is a schematic plan view of the module according to the sixth embodiment based on the present disclosure.

A module according to a sixth embodiment based on the present disclosure will be described with reference to FIGS. 11 to 12. FIG. 11 shows a cross-sectional view of a module 106 according to the present embodiment. FIG. 12 shows a plan view of module 106 from which a portion of shield film 8 that covers an upper surface of module 106, sealing resin 6, electronic components 32 and 33, and wire 4 are removed. Module 106 includes pad electrodes 7*a* and 7*b*. Pad electrodes 7*a* and 7*b* are disposed on substrate first surface 1*a*. Pad electrode 7*a* is disposed along a side on the left side of substrate 1 in FIG. 12. First wire 41, second wire 42 and third wire 43 are collectively connected to pad electrode 7*a*. Pad electrode 7*b* is disposed to surround three sides of electronic component 31. Electronic component 31 and electronic component 34 are mounted on substrate first surface 1*a* of substrate 1 and pad electrode 7*b* is disposed to separate electronic components 31 and 34. A plurality of wires 45 are connected to one pad electrode 7*b*. The plurality of wires 45 are connected to shield film 8 on first surface 6*a* of sealing resin 6.

Module 106 according to the present embodiment can also be expressed as follows. In module 106, the one or more electronic components include a first electronic component and a second electronic component. In the example described here, electronic component 31 corresponds to the first electronic component and electronic component 34 corresponds to the second electronic component. The plurality of wires 45 are connected to pad electrode 7*b* serving as a first pad electrode, which is one of the one or more pad electrodes. The plurality of wires 45 are connected to shield film 8 on first surface 6*a*. The plurality of wires 45 are disposed to separate the first electronic component and the second electronic component.

In the present embodiment, the plurality of wires 45 are disposed densely to separate the first electronic component and the second electronic component. Therefore, shielding between the first electronic component and the second electronic component can be reinforced.

For example, when there are a transmission area and a reception area in substrate first surface 1*a* of the module, it is conceivable to arrange a plurality of wires like a wall to separate the transmission area and the reception area. It is also conceivable to completely or partially surround each of the transmission area and the reception area by an arrangement of a plurality of wires, thereby protecting, from an undesirable electromagnetic wave, an area that does not belong to the transmission area and the reception area.

Seventh Embodiment

Figure 13:
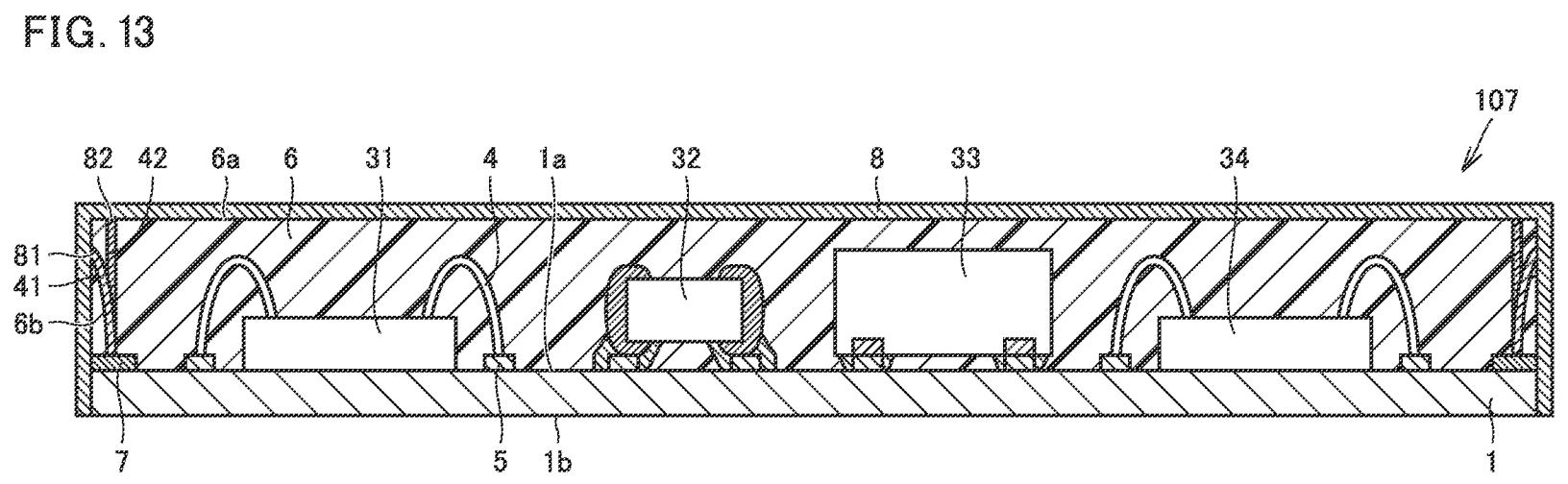
Figure 14:
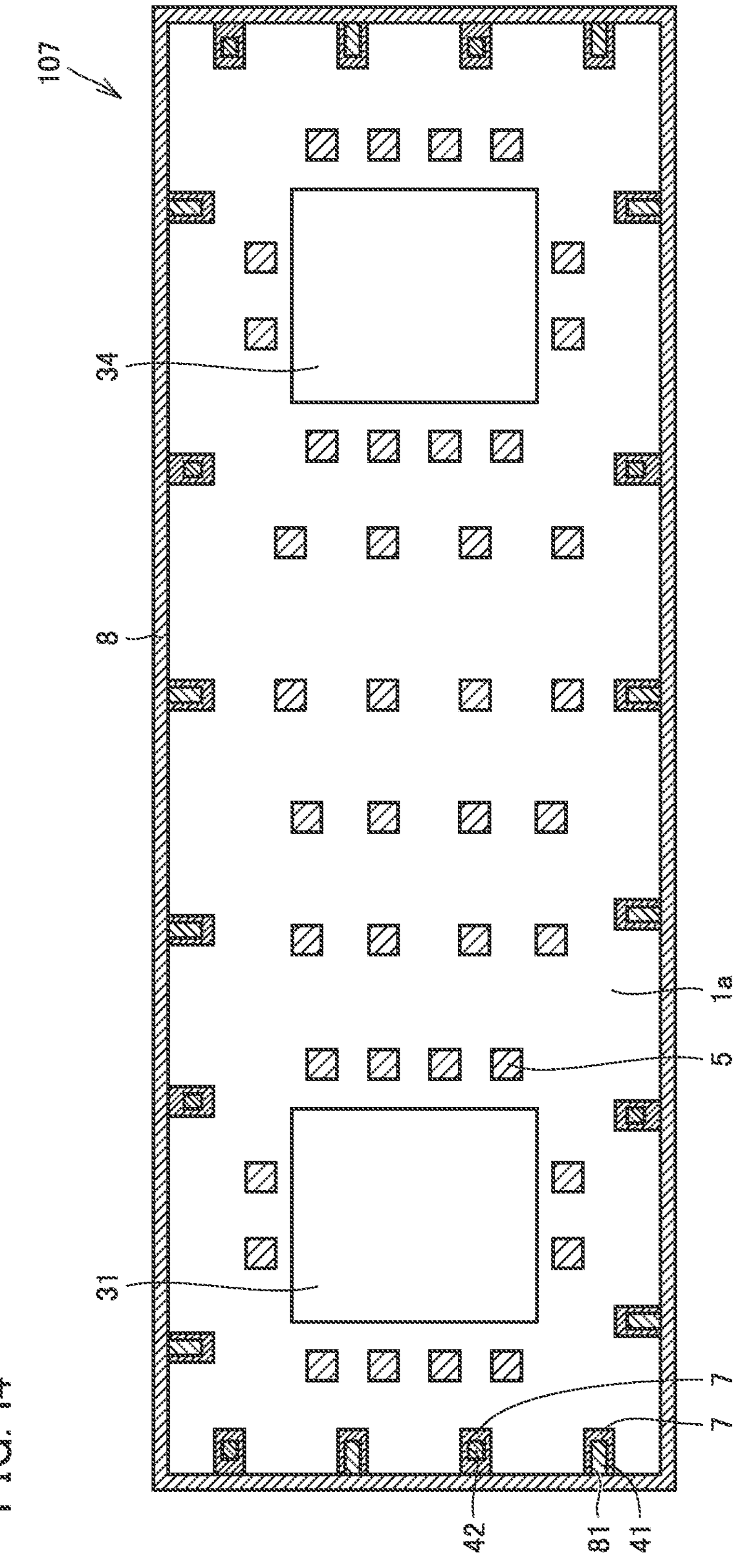
FIG. 14 is a schematic plan view of the module according to the seventh embodiment based on the present disclosure.

A module according to a seventh embodiment based on the present disclosure will be described with reference to FIGS. 13 to 14. FIG. 13 shows a cross-sectional view of a module 107 according to the present embodiment. Module 107 and module 102 described in the second embodiment are common in terms of a basic configuration. FIG. 14 shows a plan view of module 107 from which a portion of shield film 8 that covers an upper surface of module 107, sealing resin 6, electronic components 32 and 33, and wire 4 are removed.

In the present embodiment, one or more pad electrodes 7 are connected to shield film 8 at a boundary between second surface 6*b* of sealing resin 6 and the reference surface. Pad electrodes 7 extend to reach an end of substrate first surface 1*a*.

In the present embodiment, since not only first wire 41 and second wire 42 but also pad electrodes 7 are connected to shield film 8, multiple GND connections to shield film 8 can be achieved and shielding can be reinforced. When shield film 8 is formed by sputtering, shield film 8 is thin, and thus, electrical connection may in some cases be insufficient even if connection to shield film 8 is made by the wires. However, connection to shield film 8 by pad electrodes 7 makes it possible to ensure a large cross-sectional area of a connection portion, and thus, more reliable connection can be achieved. A resistance value in electrical connection to shield film 8 can be reduced and grounding of shield film 8 can be reinforced.

In the present embodiment, since sufficient grounding of shield film 8 can also be achieved at the height of substrate first surface 1*a* of substrate 1, shielding at a low position can be sufficiently reinforced.

Modification

Figure 15:
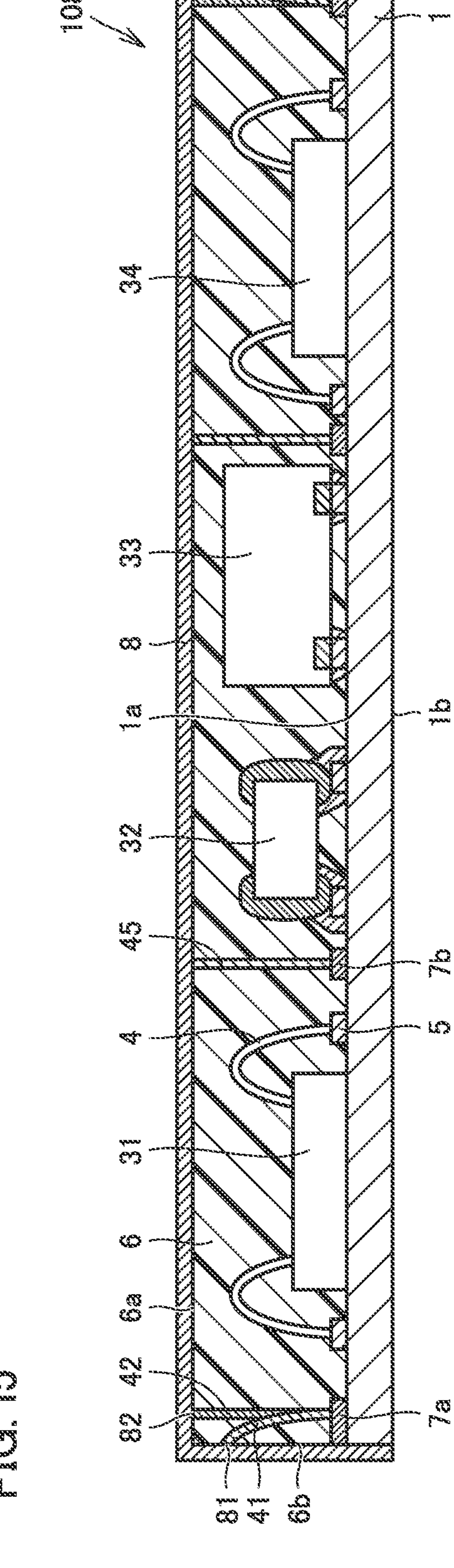
FIG. 15 is a cross-sectional view of a module according to a modification of the seventh embodiment based on the present disclosure.
Figure 16:
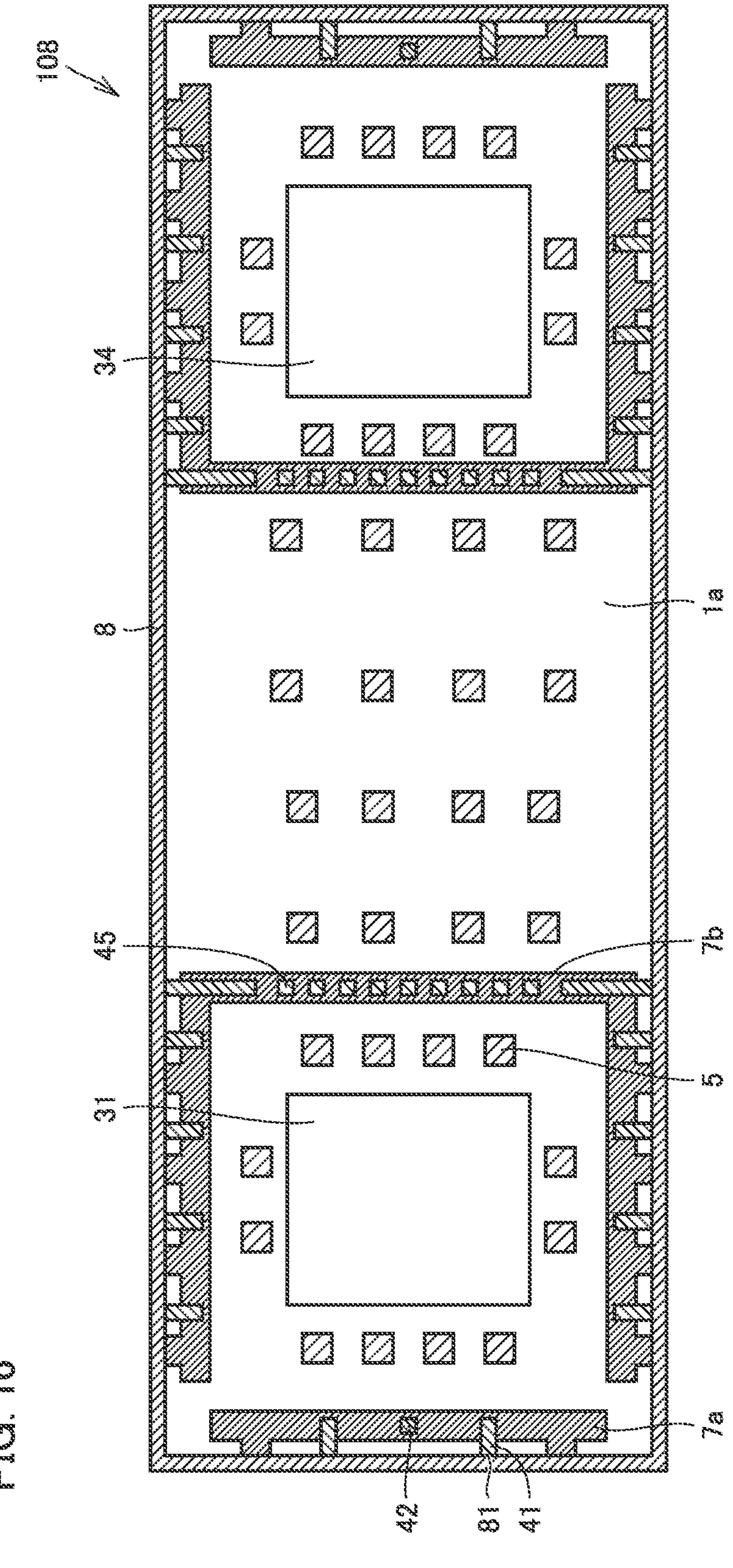
FIG. 16 is a schematic plan view of the module according to the modification of the seventh embodiment based on the present disclosure.

Furthermore, a configuration like a module 108 shown in FIGS. 15 and 16 is also conceivable as a modification of the present embodiment. Module 108 corresponds to a combination of the configuration of module 107 described in the present embodiment and the configuration of module 106 described in the sixth embodiment. In module 108, a part of pad electrodes 7*a* and 7*b* to which a plurality of wires are collectively connected extend to an outer perimeter of substrate first surface 1*a* and are electrically connected to shield film 8.

Module 108 can also be expressed as follows. In module 108, both first wire 41 and second wire 42 are connected to pad electrode 7*a* serving as a second pad electrode, which is one of the one or more pad electrodes. A part of the second pad electrode extends and is connected to shield film 8 at a boundary between second surface 6*b* and the reference surface. By adopting such a configuration, the effects of both of the sixth and seventh embodiments can be achieved.

(Configuration of Module that does not Include Substrate)

Modules described in eighth to tenth embodiments below do not include a substrate. That is, these modules have a so-called core-less structure. In these modules, a lower surface 6*c* of sealing resin 6 corresponds to "reference surface". Lower surface 6*c* of sealing resin 6 is exposed to the outside as it is. In these modules, lower surfaces of electronic components 31 and 34, and lower surfaces of pad electrodes 5, 7, 7*a*, and 7*b* are in the same plane as lower surface 6*c*.

Eighth Embodiment

Figure 17:
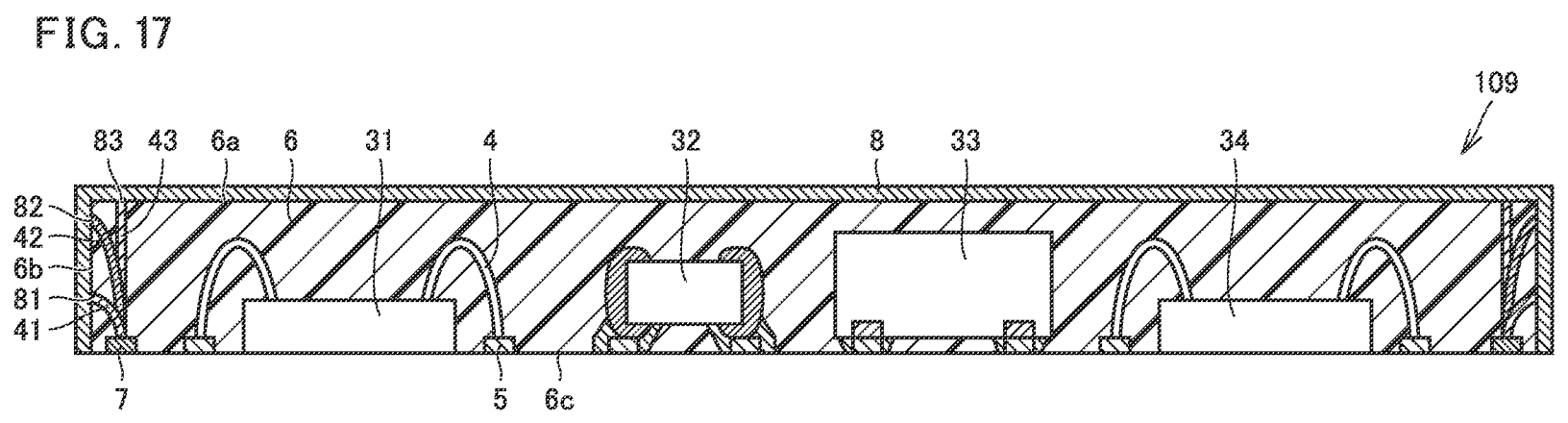

The module according to the eighth embodiment based on the present disclosure will be described with reference to FIGS. 17 to 18. FIG. 17 shows a cross-sectional view of a module 109 according to the present embodiment. Module 109 and module 103 described in the third embodiment are common in terms of a basic configuration. Module 109 does not include substrate 1.

Figure 18:
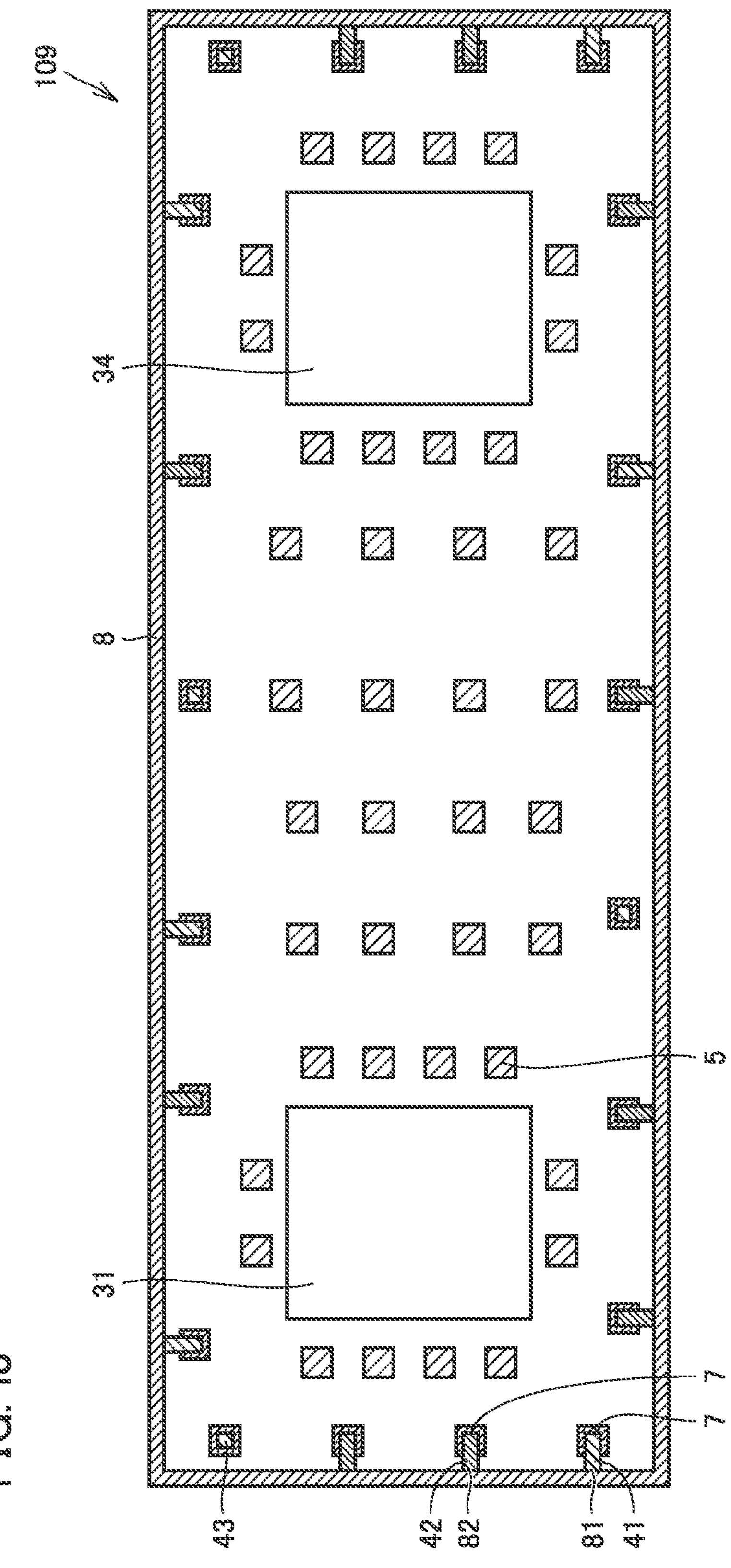
FIG. 18 is a schematic plan view of the module according to the eighth embodiment based on the present disclosure.

FIG. 18 shows a plan view of module 109 from which a portion of shield film 8 that covers an upper surface of module 109, sealing resin 6, electronic components 32 and 33, and wire 4 are removed.

The present embodiment can also achieve the effect similar to that of the third embodiment.

Ninth Embodiment

Figure 19:
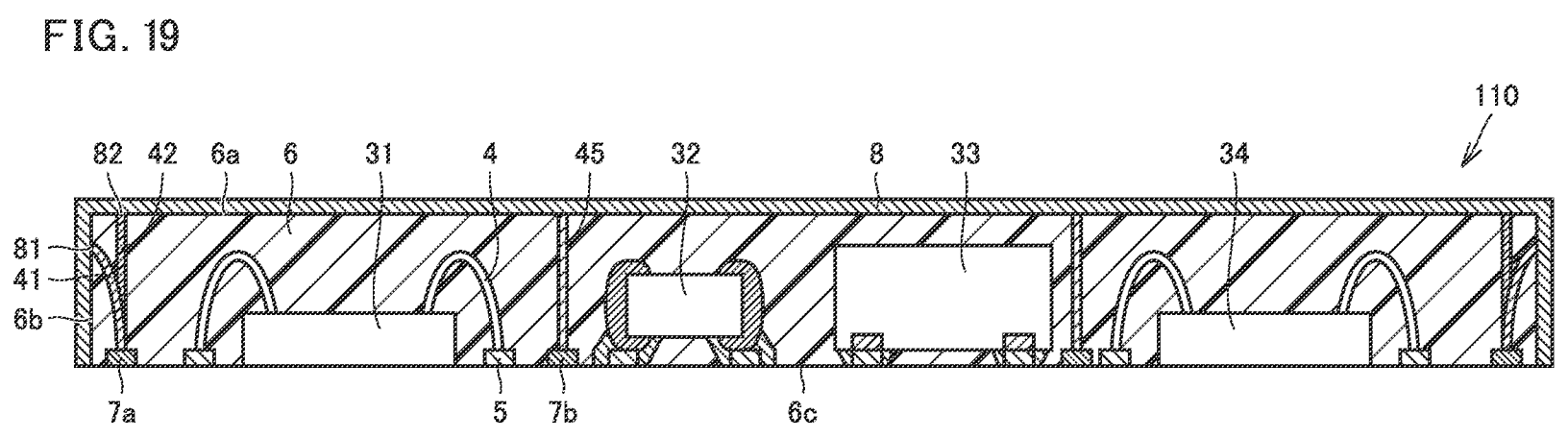

The module according to the ninth embodiment based on the present disclosure will be described with reference to FIGS. 19 to 20. FIG. 19 shows a cross-sectional view of a module 110 according to the present embodiment. Module 110 and module 106 described in the sixth embodiment are common in terms of a basic configuration. Module 110 does not include substrate 1.

Figure 20:
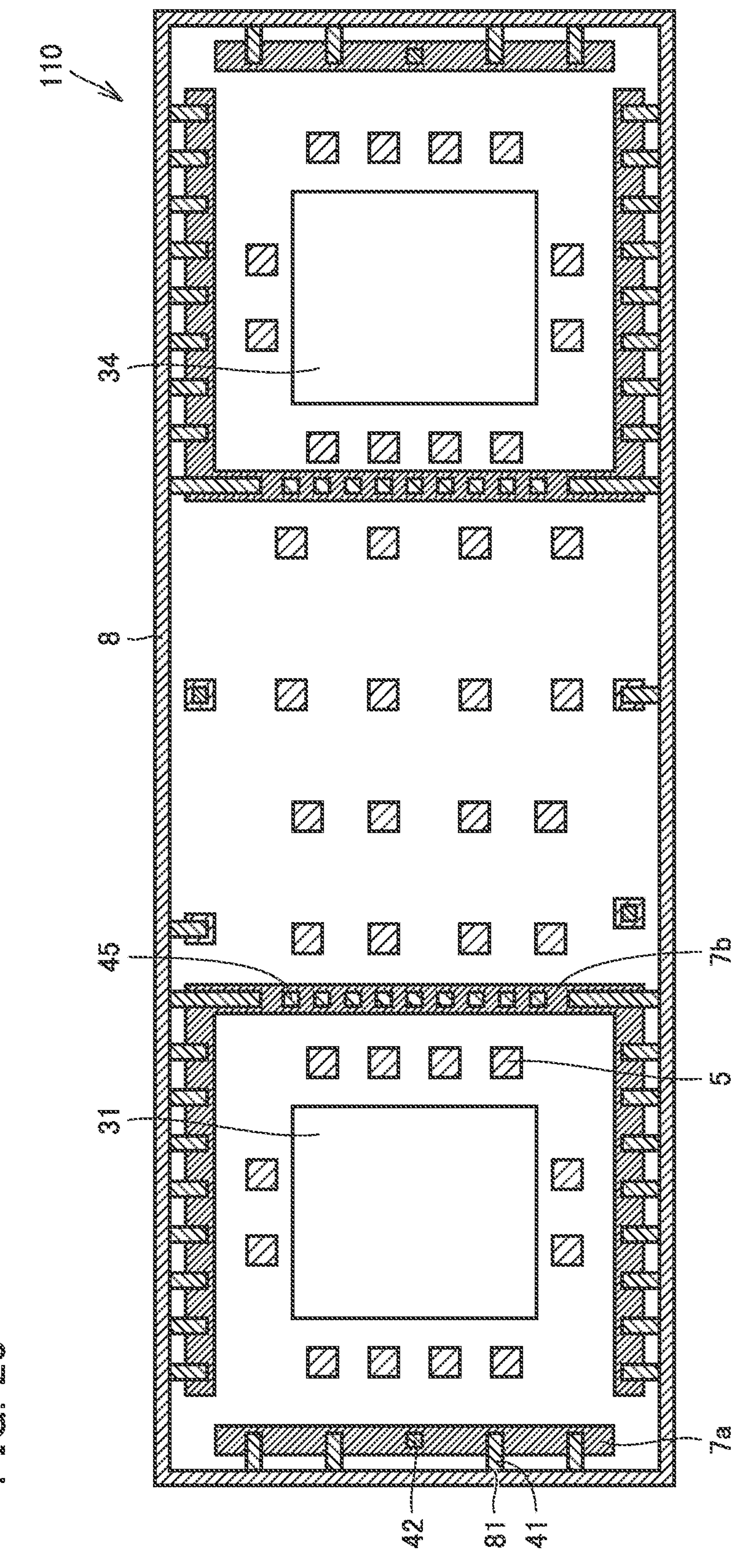
FIG. 20 is a schematic plan view of the module according to the ninth embodiment based on the present disclosure.

FIG. 20 shows a plan view of module 110 from which a portion of shield film 8 that covers an upper surface of module 110, sealing resin 6, electronic components 32 and 33, and wire 4 are removed. In module 106 according to the sixth embodiment, the wires including third wire 43 are connected to the destinations having the three different heights. However, in module 110 according to the present embodiment, there are two different height variations of the destinations to which the wires are connected. In module 110 according to the present embodiment as well, the height variations of the destinations to which the wires are connected may be increased to three or more.

The present embodiment can also achieve the effect similar to that of the sixth embodiment.

Tenth Embodiment

Figure 21:
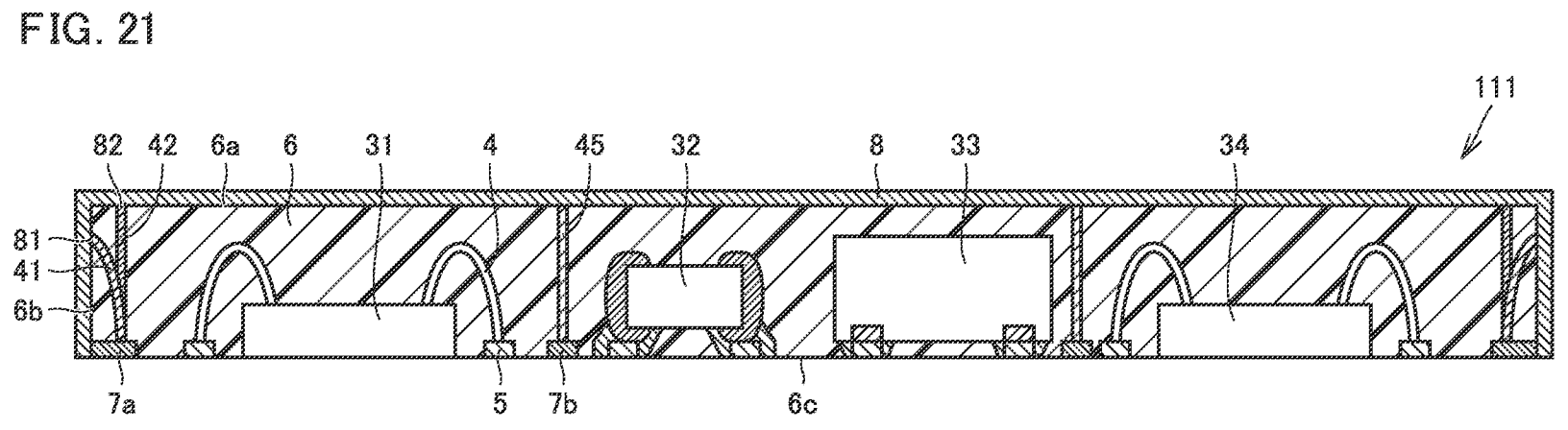

The module according to the tenth embodiment based on the present disclosure will be described with reference to FIGS. 21 to 22. FIG. 21 shows a cross-sectional view of a module 111 according to the present embodiment. Module 111 and module 108 described as the modification of the seventh embodiment are common in terms of a basic configuration. Module 111 does not include substrate 1.

Figure 22:
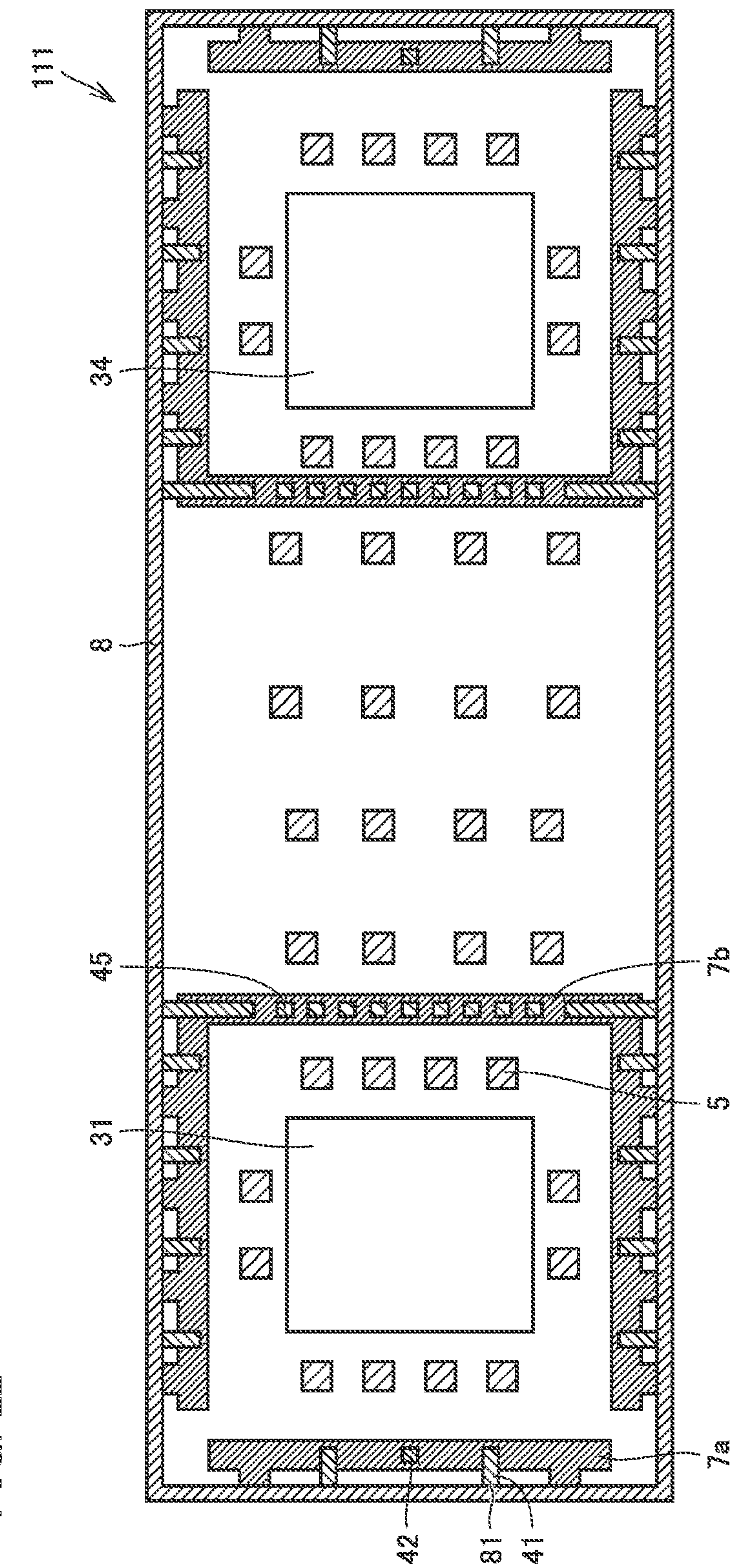
FIG. 22 is a schematic plan view of the module according to the tenth embodiment based on the present disclosure.

FIG. 22 shows a plan view of module 111 from which a portion of shield film 8 that covers an upper surface of module 111, sealing resin 6, electronic components 32 and 33, and wire 4 are removed.

The present embodiment can also achieve the effect similar to that of the modification of the seventh embodiment.

As described above, in each of the eighth to tenth embodiments, the module does not include a substrate, and the reference surface is the lower surface of the module. Even such a configuration can achieve the effect of the present disclosure.

The module having a core-less structure described in each of the eighth to tenth embodiments may, for example, be produced as follows. First, a dummy substrate having pad electrodes disposed on a surface thereof is prepared. Electronic components are mounted on the surface of the dummy substrate as needed, and necessary wire bonding is performed. Furthermore, sealing resin 6 is also disposed. Thereafter, the dummy substrate is removed and sealing resin 6 is cut into pieces each equivalent in size to an individual module. Alternatively, without removing the dummy substrate, sealing resin 6 and the dummy substrate are cut into pieces each equivalent in size to an individual module, and then, the dummy substrate is removed. Furthermore, shield film 8 is formed as needed. By doing so, a module having a core-less structure can be obtained.

As described above, in each of the first to seventh embodiments, the module includes substrate 1 and the reference surface is the surface of substrate 1 on the sealing resin 6 side. Even such a configuration can achieve the effect of the present disclosure.

Some features in the embodiments above may be adopted as being combined as appropriate.

It should be understood that the embodiments disclosed herein are illustrative and non-restrictive in every respect. The scope of the present disclosure is defined by the terms of the claims and is intended to include any modifications within the scope and meaning equivalent to the terms of the claims.

1 substrate; 1*a* substrate first surface; 1*b* substrate second surface; 4 wire (for mounting an electronic component); 5 pad electrode; 6 sealing resin; 6*a* first surface; 6*b* second surface; 6*c* lower surface; 7, 7*a*, 7*b*, 7*c* pad electrode (for grounding); 8 shield film; 31, 32, 33, 34 electronic component; 41 first wire; 42 second wire; 43 third wire; 45 wire; 81 first point; 82 second point; 83 third point; 101, 102, 103, 104, 105, 106, 107, 108, 109, 110, 111 module.

The invention claimed is:

1. A module comprising:

one or more electronic components disposed and aligned such that lower ends thereof are positioned on a reference surface;

one or more pad electrodes disposed such that lower ends thereof are positioned on the reference surface; and a sealing resin disposed to seal the one or more pad electrodes and the one or more electronic components from above, wherein the sealing resin has a first surface serving as an upper surface and a second surface serving as a side surface, the first surface and the second surface are covered with a shield film, a first wire is disposed in the sealing resin to electrically connect the one or more pad electrodes and the shield film at a first point selected from the first surface and the second surface, a second wire is disposed in the sealing resin to electrically connect the one or more pad electrodes and the shield film at a second point selected from the first surface and the second surface, and the first point and the second point are different in height when viewed from the reference surface.

2. The module according to claim 1, wherein the one or more pad electrodes are connected to the shield film at a boundary between the second surface and the reference surface.

3. The module according to claim 1, wherein the one or more electronic components include a first electronic component and a second electronic component, a plurality of wires are connected to a first pad electrode being one of the one or more pad electrodes, the plurality of wires are connected to the shield film on the first surface, and the plurality of wires are disposed to separate the first electronic component and the second electronic component.

4. The module according to claim 1, wherein the first wire and the second wire are both connected to a second pad electrode being one of the one or more pad electrodes, and a part of the second pad electrode extends and is connected to the shield film at a boundary between the second surface and the reference surface.

5. The module according to claim 1, wherein the reference surface is a lower surface of the module.

6. The module according to claim 1, wherein the module includes a substrate, and the reference surface is a surface of the substrate facing the sealing resin.

7. The module according to claim 2, wherein the reference surface is a lower surface of the module.

8. The module according to claim 3, wherein the reference surface is a lower surface of the module.

9. The module according to claim 4, wherein the reference surface is a lower surface of the module.

10. The module according to claim 2, wherein the module includes a substrate, and the reference surface is a surface of the substrate facing the sealing resin.

11. The module according to claim 3, wherein the module includes a substrate, and the reference surface is a surface of the substrate facing the sealing resin.

12. The module according to claim 4, wherein the module includes a substrate, and the reference surface is a surface of the substrate facing the scaling resin.

* * * * *